(12) United States Patent
Chen et al.

(10) Patent No.: US 9,318,155 B2
(45) Date of Patent: Apr. 19, 2016

(54) CLOCK ADJUSTING CIRCUIT, MEMORY STORAGE DEVICE, AND MEMORY CONTROL CIRCUIT UNIT

(71) Applicant: PHISON ELECTRONICS CORP., Miaoli (TW)

(72) Inventors: Wei-Yung Chen, Hsinchu County (TW); Yan-An Lin, Taichung (TW)

(73) Assignee: PHISON ELECTRONICS CORP., Miaoli (TW)

( * ) Notice: Subject to any disclaimer, the term of this patent is extended or adjusted under 35 U.S.C. 154(b) by 327 days.

(21) Appl. No.: 14/011,773

(22) Filed: Aug. 28, 2013

(65) Prior Publication Data

US 2015/0003139 A1    Jan. 1, 2015

(30) Foreign Application Priority Data

Jun. 27, 2013  (TW) .............................. 102122987 A

(51) Int. Cl.
| | |
|---|---|
| G11C 5/02 | (2006.01) |
| G11C 29/02 | (2006.01) |
| G11C 7/22 | (2006.01) |
| H03L 7/08 | (2006.01) |
| H03L 7/18 | (2006.01) |

(52) U.S. Cl.
CPC ................ G11C 5/025 (2013.01); G11C 7/222 (2013.01); G11C 29/023 (2013.01); G11C 29/028 (2013.01); H03L 7/08 (2013.01); H03L 7/18 (2013.01)

(58) Field of Classification Search
CPC ...... G11C 5/025; G11C 7/222; G11C 29/023; G11C 29/028; H03L 7/00
See application file for complete search history.

(56) References Cited

U.S. PATENT DOCUMENTS

| | | | |
|---|---|---|---|
| 5,920,235 A | 7/1999 | Beards et al. | |
| 6,043,715 A | 3/2000 | Bailey et al. | |
| 8,737,126 B2* | 5/2014 | Lin ..................... | G11C 11/5628 365/185.03 |
| 2004/0189403 A1* | 9/2004 | Suzuki ................ | H03C 3/0958 331/16 |
| 2008/0122029 A1* | 5/2008 | Wang .................... | H01L 28/10 257/531 |

OTHER PUBLICATIONS

"Office Action of Taiwan Counterpart Application", issued on Oct. 7, 2015, p.1-p.7.

* cited by examiner

*Primary Examiner* — Richard Elms
*Assistant Examiner* — Mohammed A Bashar
(74) *Attorney, Agent, or Firm* — Jianq Chyun IP Office

(57) ABSTRACT

A memory storage device, a memory control circuit unit, and a clock adjusting circuit disposed on a plurality of layers are provided. The clock adjusting circuit includes a detection circuit, a control voltage generating circuit, and a voltage-controlled oscillator (VCO). The detection circuit detects a signal characteristic difference between an input signal and an output signal to generate a first signal. The control voltage generating circuit is coupled to the detection circuit and generates a control voltage according to the first signal. The VCO is coupled to the control voltage generating circuit and includes an inductor and a capacitor. The VCO receives the control voltage and starts oscillating according to an impedance characteristic of the inductor and the capacitor to generate the output signal. The inductor is disposed on a pad layer among the layers. Thereby, the manufacturing cost is reduced.

27 Claims, 9 Drawing Sheets

CLOCK ADJUSTING CIRCUIT, MEMORY STORAGE DEVICE, AND MEMORY CONTROL CIRCUIT UNIT

CROSS-REFERENCE TO RELATED APPLICATION

This application claims the priority benefit of Taiwan application serial no. 102122987, filed on Jun. 27, 2013. The entirety of the above-mentioned patent application is hereby incorporated by reference herein and made a part of this specification.

BACKGROUND

1. Technology Field

The present invention generally relates to a clock adjusting circuit, and more particularly, to a clock adjusting circuit disposed on a plurality of layers of a die, a memory storage device, and a memory control circuit unit.

2. Description of Related Art

Along with the widespread of digital cameras, cell phones, and MP3 players in recently years, the consumers' demand to storage media has increased drastically. Rewritable non-volatile memory module (for example, flash memory) is one of the most adaptable storage media to aforementioned portable multimedia devices due to its many characteristics such as data non-volatility, low power consumption, small volume, and non-mechanical structure.

A rewritable non-volatile memory module is generally coupled to a host system through a connect interface unit. The connect interface unit may include a clock data recovery circuit or a phase lock loop for recovering a clock from the host system or generating a stable clock according to a reference clock. In some cases, a voltage-controlled oscillator (VCO) is adopted in the clock data recovery circuit or the phase lock loop. The VCO can be implemented with any type of oscillator, such as an inductance-capacitance (LC) VCO or a ring-type VCO. If a LC VCO is adopted, the inductor takes up a large area and is usually disposed on a thick copper layer to achieve a better quality factor (Q factor). Or, a filter in the phase lock loop includes a capacitor which also takes up a lot of space. Thereby, how to dispose aforementioned electronic elements to reduce the manufacturing cost has become a subject to be resolved in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a clock adjusting circuit, a memory storage device and a memory control circuit unit with reduced manufacturing cost.

An exemplary embodiment of the present invention provides a clock adjusting circuit disposed on a die. The clock adjusting circuit has a plurality of layers. The clock adjusting circuit includes a detection circuit, a control voltage generating circuit, and a voltage-controlled oscillator (VCO). The detection circuit detects a signal characteristic difference between an input signal and an output signal to generate a first signal. The control voltage generating circuit is coupled to the detection circuit. The control voltage generating circuit generates a control voltage according to the first signal. The VCO is coupled to the control voltage generating circuit. The VCO includes an inductor and a capacitor. The VCO receives the control voltage and oscillates according to an impedance characteristic of the inductor and the capacitor to generate the output signal. The inductor is disposed on a pad layer among the layers.

An exemplary embodiment of the present invention provides a memory storage device. The memory storage device includes a connect interface unit, a rewritable non-volatile memory module, and a memory control circuit unit. The connect interface unit is configured to couple to a host system. The rewritable non-volatile memory module includes a plurality of physical erasing units. The memory control circuit unit is coupled to the connect interface unit and the rewritable non-volatile memory module. The connect interface unit includes a clock adjusting circuit. The clock adjusting circuit is disposed on a die. The die has a plurality of layers. The clock adjusting circuit includes a detection circuit, a control voltage generating circuit, and a voltage-controlled oscillator (VCO). The detection circuit detects a signal characteristic difference between an input signal and an output signal to generate a first signal. The control voltage generating circuit is coupled to the detection circuit. The control voltage generating circuit generates a control voltage according to the first signal. The VCO is coupled to the control voltage generating circuit. The VCO includes an inductor and a capacitor. The VCO receives the control voltage and oscillates according to an impedance characteristic of the inductor and the capacitor to generate the output signal. The inductor is disposed on a pad layer among the layers.

An exemplary embodiment of the present invention provides a memory storage device. The memory storage device includes a connect interface unit, a rewritable non-volatile memory module, and a memory control circuit unit. The connect interface unit is configured to couple to a host system. The rewritable non-volatile memory module includes a plurality of physical erasing units. The memory control circuit unit is coupled to the connect interface unit and the rewritable non-volatile memory module. The connect interface unit includes an inductor and a capacitor. The inductor is disposed on a first layer of a die. The capacitor is disposed on a second layer of the die. The first layer is different from the second layer, and when viewed from a direction perpendicular to the first layer, the inductor and the capacitor at least partially overlap each other.

An exemplary embodiment of the present invention provides a memory control circuit unit, which comprises a connect interface unit and a memory management circuit. The connect interface unit is configured to couple to a host system. The memory management circuit is coupled to the connect interface unit. The connect interface unit comprises a clock adjusting circuit, which is disposed on a die having a plurality of layers. The clock adjusting circuit includes a detection circuit, a control voltage generating circuit, and a voltage-controlled oscillator (VCO). The detection circuit detects a signal characteristic difference between an input signal and an output signal to generate a first signal. The control voltage generating circuit is coupled to the detection circuit. The control voltage generating circuit generates a control voltage according to the first signal. The VCO is coupled to the control voltage generating circuit. The VCO includes an inductor and a capacitor. The VCO receives the control voltage and oscillates according to an impedance characteristic of the inductor and the capacitor to generate the output signal. The inductor is disposed on a pad layer among the layers.

As described above, exemplary embodiments of the present invention provide a clock adjusting circuit, a memory storage device and a memory control circuit unit, in which because a capacitor is disposed below an inductor, the surface area of a chip is reduced, and accordingly the manufacturing cost, is reduced.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

These and other exemplary embodiments, features, aspects, and advantages of the present invention will be described and become more apparent from the detailed description of exemplary embodiments when read in conjunction with accompanying drawings.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF THE EMBODIMENTS

Figure 1A:
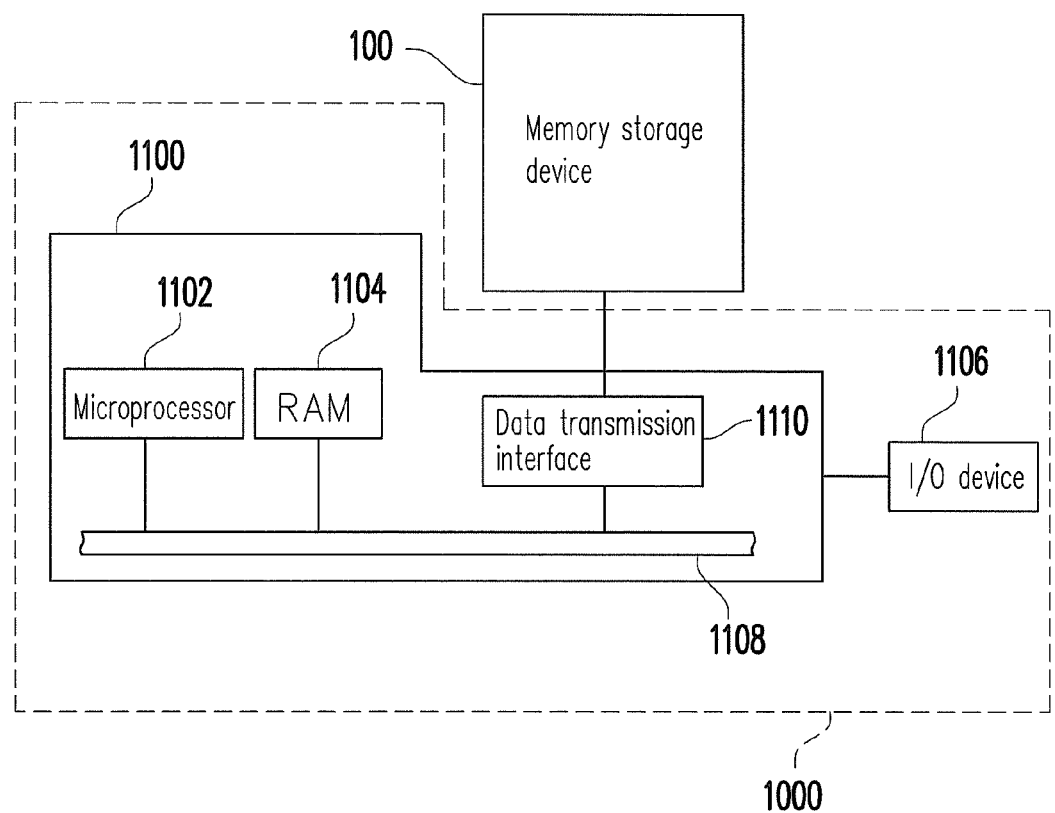
FIG. 1A illustrates a host system and a memory storage device according to an exemplary embodiment.

Reference will now be made in detail to the present preferred embodiments of the present invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

First Exemplary Embodiment

Generally, a memory storage device (also referred to as a memory storage system) includes a rewritable non-volatile memory module and a controller (also referred to as a control circuit). The memory storage device is usually used along with a host system so that the host system can write data into or read data from the memory storage device.

FIG. 1A illustrates a host system and a memory storage device according to an exemplary embodiment.

Figure 1B:
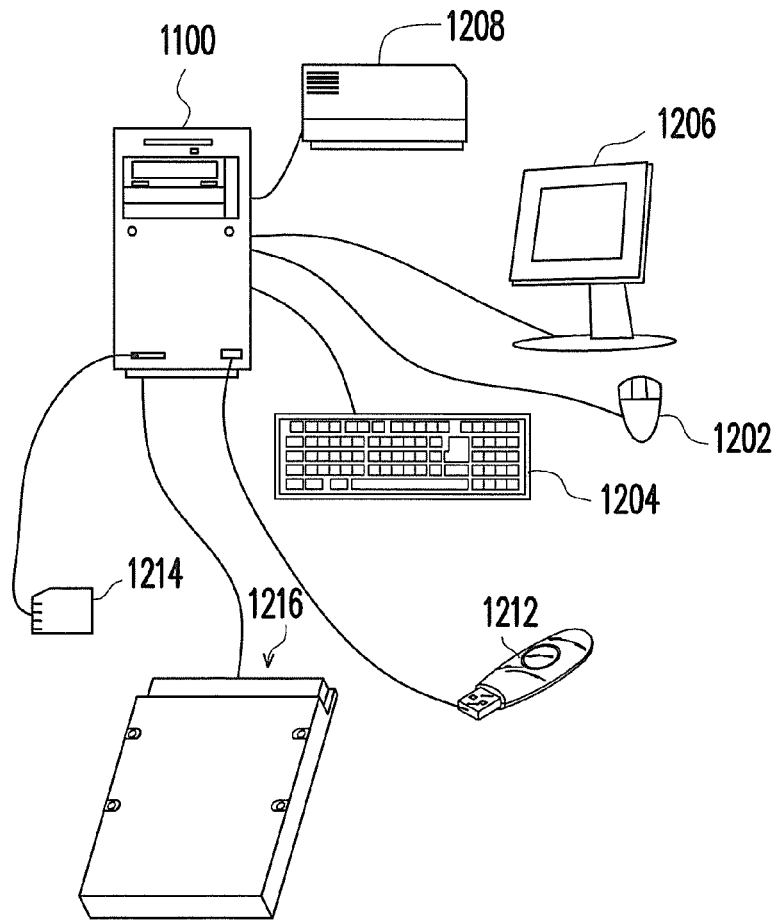
FIG. 1B is a diagram of a computer, an input/output (I/O) device, and a memory storage device according to an exemplary embodiment.

Referring to FIG. 1A, the host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. However, the I/O device 1106 is not limited to the devices illustrated in FIG. 1B and may further include other devices.

In the present embodiment, a memory storage device 100 is coupled to other components of the host system 1000 through the data transmission interface 1110. Data can be written into or read from the memory storage device 100 through the operations of the microprocessor 1102, the RAM 1104, and the I/O device 1106. The memory storage device 100 is a rewritable non-volatile memory storage device, such as the flash drive 1212, the memory card 1214, or the solid state drive (SSD) 1216 illustrated in FIG. 1B.

Figure 1C:
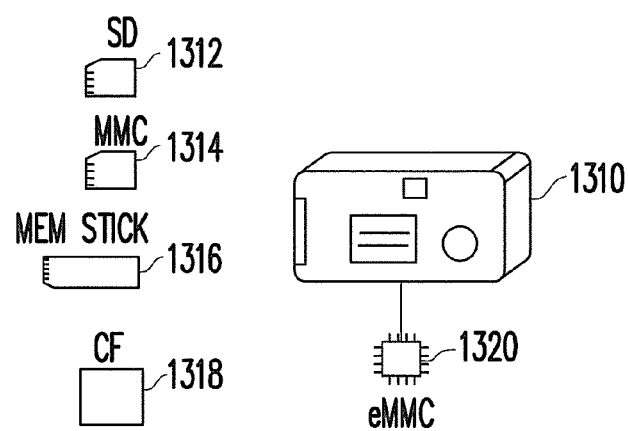
FIG. 1C is a diagram of a host system and a memory storage device according to an exemplary embodiment.

Generally speaking, the host system 1000 can be substantially any system that works with the memory storage device 100 to store data. Even though the host system 1000 is described as a computer system in the present exemplary embodiment, in another exemplary embodiment of the present invention, the host system 1000 may also be a digital camera, a video camera, a communication device, an audio player, or a video player. For example, if the host system is a digital camera (video camera) 1310, the rewritable non-volatile memory storage device is then a secure digital (SD) card 1312, a multi media card (MMC) card 1314, a memory stick (MS) 1316, a compact flash (CF) card 1318, or an embedded storage device 1320 (as shown in FIG. 1C) used by the digital camera (video camera) 1310. The embedded storage device 1320 includes an embedded MMC (eMMC). It should be mentioned that an eMMC is directly coupled to the motherboard of a host system.

Figure 2:
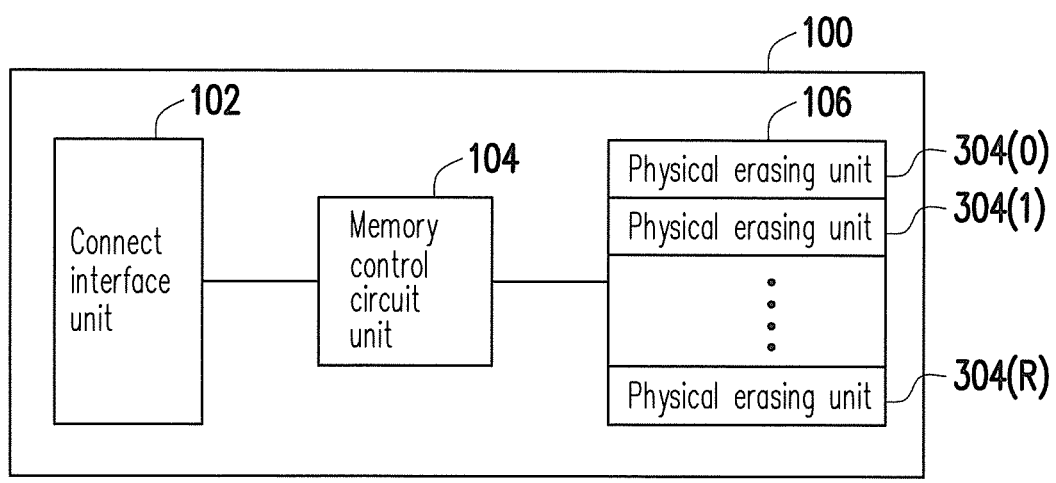
FIG. 2 is a schematic block diagram of the memory storage device in FIG. 1A.

FIG. 2 is a schematic block diagram of the memory storage device in FIG. 1A.

Referring to FIG. 2, the memory storage device 100 includes a connect interface unit 102, a memory control circuit unit 104, and a rewritable non-volatile memory module 106.

In the present exemplary embodiment, the connect interface unit 102 complies with the serial advanced technology attachment (SATA) standard. However, the present invention is not limited thereto, and the connect interface unit 102 may also comply with the parallel advanced technology attachment (PATA) standard, the Institute of Electrical and Electronic Engineers (IEEE) 1394 standard, the peripheral component interconnect (PCI) express standard, the universal serial bus (USB) standard, the SD interface standard, the ultra high speed-I (UHS-I) interface standard, the ultra high speed-II (UHS-II) interface standard, the MS interface standard, the MMC interface standard, the eMMC interface standard, the universal flash storage (UFS) interface standard, the CF interface standard, the integrated device electronics (IDE) standard, or any other suitable standard. In the present exemplary embodiment, the connect interface unit 102 may be embedded in a chip with a memory control circuit unit 104, or disposed outside of a chip comprising the memory control circuit unit 104.

The memory control circuit unit 104 executes a plurality of logic gates or control instructions implemented in a hardware form or a firmware form and performs data writing, reading, and erasing operations on the rewritable non-volatile memory module 106 according to commands issued by the host system 1000.

In one exemplary embodiment, the connect interface unit 102 is disposed inside the memory control circuit unit 104, and the memory control circuit unit 104 further comprises a memory management circuit. The memory management circuit is coupled to the connect interface unit 102 and is configured to control the overall operations of the memory control circuit unit 104. Specifically, the memory management circuit has a plurality of control commands. When the memory storage device 100 is operated, the control commands are executed to perform the said data writing, reading, and erasing operations on the rewritable non-volatile memory module 106. In another exemplary embodiment, the memory control circuit unit 104 may further comprise a memory interface and a buffer memory, that are both copied to the memory management circuit. In addition, the memory interface is configured to couple to the rewritable non-volatile memory module 106.

The rewritable non-volatile memory module 106 is coupled to the memory control circuit unit 104 and configured to store data written by the host system 1000. The rewritable non-volatile memory module 106 has physical erasing units 304(0)-304(R). The physical erasing units 304(0)-304(R) may belong to the same memory die or different memory dies. Each physical erasing unit has a plurality of physical programming units, and the physical programming units belonging to the same physical erasing unit can be individually written but have to be erased all together. Each physical erasing unit may be composed of 128 physical programming units. However, the present invention is not limited thereto, and each physical erasing unit may also be composed of 64, 256, or any other number of physical programming units.

To be specific, physical erasing unit is the smallest unit for erasing data. Namely, each physical erasing unit contains the least number of memory cells that are erased all together. Physical programming unit is the smallest unit for programming data. Namely, physical programming unit is the smallest unit for writing data. Each physical programming unit usually includes a data bit area and a redundant bit area. The data bit area includes a plurality of physical access addresses for storing user data, and the redundant bit area is used for storing system data (for example, control information and error checking and correcting (ECC) codes). In the present exemplary embodiment, the data bit area of each physical programming unit contains 4 physical access addresses, and each physical access address has a capacity of 512 bytes (B). However, the capacity and number of the physical access addresses are not limited in the present invention, and in other exemplary embodiments, a data bit area may also contain 8, 16, or more or fewer physical access addresses. The physical erasing units may be physical blocks, and the physical programming units may be physical pages or physical sectors.

In the present exemplary embodiment, the rewritable non-volatile memory module 106 is a multi level cell (MLC) NAND flash memory module (i.e., each memory cell stores a data of at least two bits). However, the present invention is not limited thereto, and the rewritable non-volatile memory module 106 may also be a single level cell (SLC) NAND flash memory module, a trinary level cell (TLC) NAND flash memory module, any other flash memory module, or any other memory module with the same characteristics.

Figure 3:
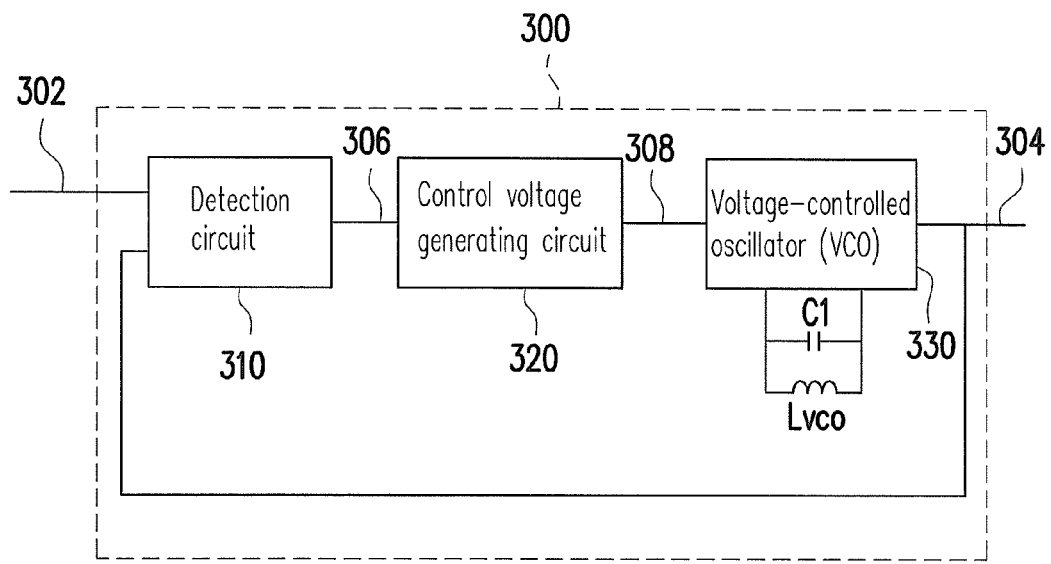
FIG. 3 is a partial block diagram of a connect interface unit according to an exemplary embodiment.

FIG. 3 is a partial block diagram of a connect interface unit according to an exemplary embodiment.

Referring to FIG. 3, the connect interface unit 102 at least includes a clock adjusting circuit 300. The clock adjusting circuit 300 receives an input signal 302 and adjusts an output signal 304 according to the frequency or phase of the input signal 302. The input signal 302 may be a signal from the host system 1000 or a signal of a circuit in the memory storage device 100. The source of the input signal 302 is not limited in the present invention. The clock adjusting circuit 300 can be implemented as a phase lock loop (PLL) or a clock data recovery (CDR) circuit. The clock adjusting circuit 300 at least includes a detection circuit 310, a control voltage generating circuit 320, and a voltage-controlled oscillator (VCO) 330. However, the present invention is not limited thereto, and the clock adjusting circuit 300 may further include other components with different implementations.

The detection circuit 310 detects a signal characteristic difference between the input signal 302 and the output signal 304 to generate a signal 306. The signal characteristic difference may be a phase difference or a frequency difference, and the detection circuit 310 may be a phase detector, a frequency detector, or a frequency/phase detector.

The control voltage generating circuit 320 is coupled to the detection circuit 310. The control voltage generating circuit 320 generates a control voltage 308 according to the signal 306. The control voltage generating circuit 320 may be a charge pump.

The VCO 330 is coupled to the control voltage generating circuit 320 and receives the control voltage 308. In the present exemplary embodiment, the VCO 330 is an inductance-capacitance (LC) VCO. To be specific, the VCO 330 includes a capacitor C1 and an inductor Lvco. The VCO 330 oscillates according to an impedance characteristic of the capacitor C1 and the inductor Lvco to generate the output signal 304. The impedance characteristic may be a capacitance or an inductance. The control voltage 308 further determines the oscillation frequency of the output signal 304.

The clock adjusting circuit 300 is disposed on a plurality of layers in a chip, where the layers are stacked together, and each layer is corresponding to a mask process. Particularly, the inductor Lvco is disposed on a pad layer among the layers. The pad layer may be the topmost conductive layer in a die and is electrically connected with a bond wire electrically connected to a lead frame. In the present exemplary embodiment, the entire inductor Lvco is disposed on the pad layer. However, in another exemplary embodiment, a part of the inductor Lvco is disposed on the pad layer, and other parts of the inductor Lvco are disposed on other layers. The material of the pad layer is substantially aluminium or aluminium compound. Herein "being substantially aluminium" means that the major material of the pad layer is aluminium or aluminium compound. However, in the present invention, the pad layer may contain other impurities. It should be noted that because the pad layer is usually very thick and a thick metal layer can reduce the dissipation of an inductor, the Q factor of the inductor Lvco can be increased. Additionally, because the inductor Lvco is disposed on the pad layer, it is not needed to add another metal layer (i.e., perform another mask process) for disposing the inductor Lvco.

Figure 4:
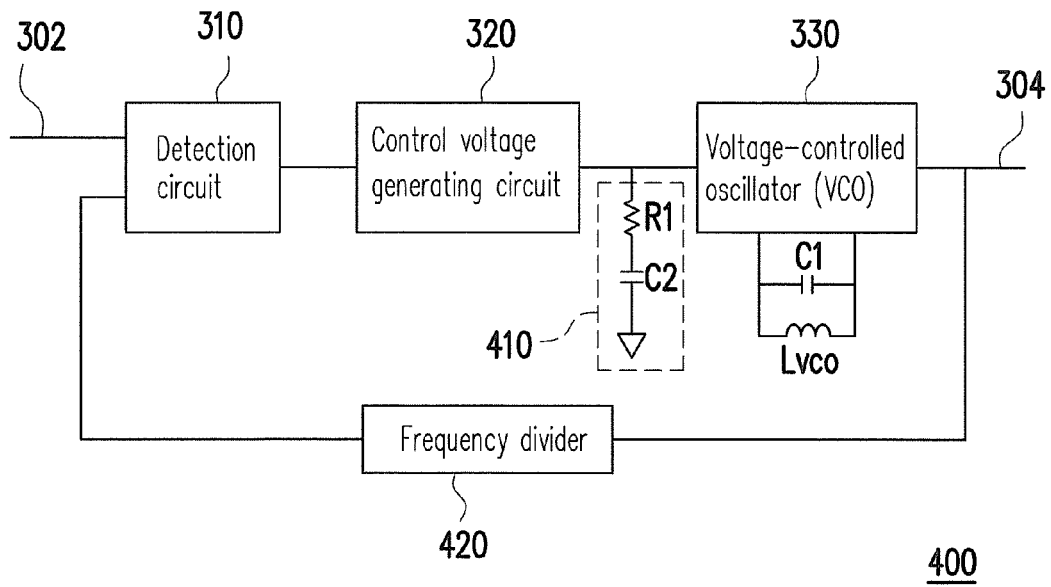
FIG. 4 is a block diagram of a clock adjusting circuit according to another exemplary embodiment.

FIG. 4 is a block diagram of a clock adjusting circuit according to another exemplary embodiment.

Referring to FIG. 4, in the exemplary embodiment illustrated in FIG. 4, the clock adjusting circuit 400 is implemented with a PLL. The clock adjusting circuit 400 includes a detection circuit 310, a control voltage generating circuit 320, a filter 410, a VCO 330, and a frequency divider 420. The detection circuit 310, the control voltage generating circuit 320, and the VCO 330 have been described above therefore will not be described herein. The filter 410 is coupled between the control voltage generating circuit 320 and the VCO 330 for eliminating the high-frequency part of the control voltage 308. The filter 410 includes a resistor R1 and a filter capacitor C2. The first end of the resistor R1 is coupled between the control voltage generating circuit 320 and the VCO 330, and the second end of the resistor R1 is coupled to the filter capacitor C2. A terminal of the frequency divider 420 is coupled to the VCO 330, and another terminal thereof is coupled to the detection circuit 310. The frequency divider 420 reduces the frequency of the output signal 304 and sends the output signal 304 back to the detection circuit 310. The operation of a PLL should be understood by those having ordinary knowledge in the art therefore will not be described herein.

Generally speaking, the filter capacitor C2 and the inductor Lvco take up a large area in a chip. However, in the present exemplary embodiment, the filter capacitor C2 is disposed on a layer (referred to as a first layer) in the chip other than the pad layer, and at least a part of the filter capacitor C2 is disposed below the inductor Lvco. For example, when viewed from a direction perpendicular to the pad layer (observing the chip perspectively), the disposing positions of the filter capacitor C2 and the inductor Lvco are at least partially overlapping each other. From another perspective, the projection of the filter capacitor C2 on the pad layer at least partially overlaps the inductor Lvco, so that the surface area of the chip is reduced. In the present exemplary embodiment, the projection of the filter capacitor C2 on the pad layer completely covers the inductor Lvco. In another exemplary embodiment, at least 50% of the projection of the filter capacitor C2 on the pad layer overlaps the inductor Lvco.

Figure 5:
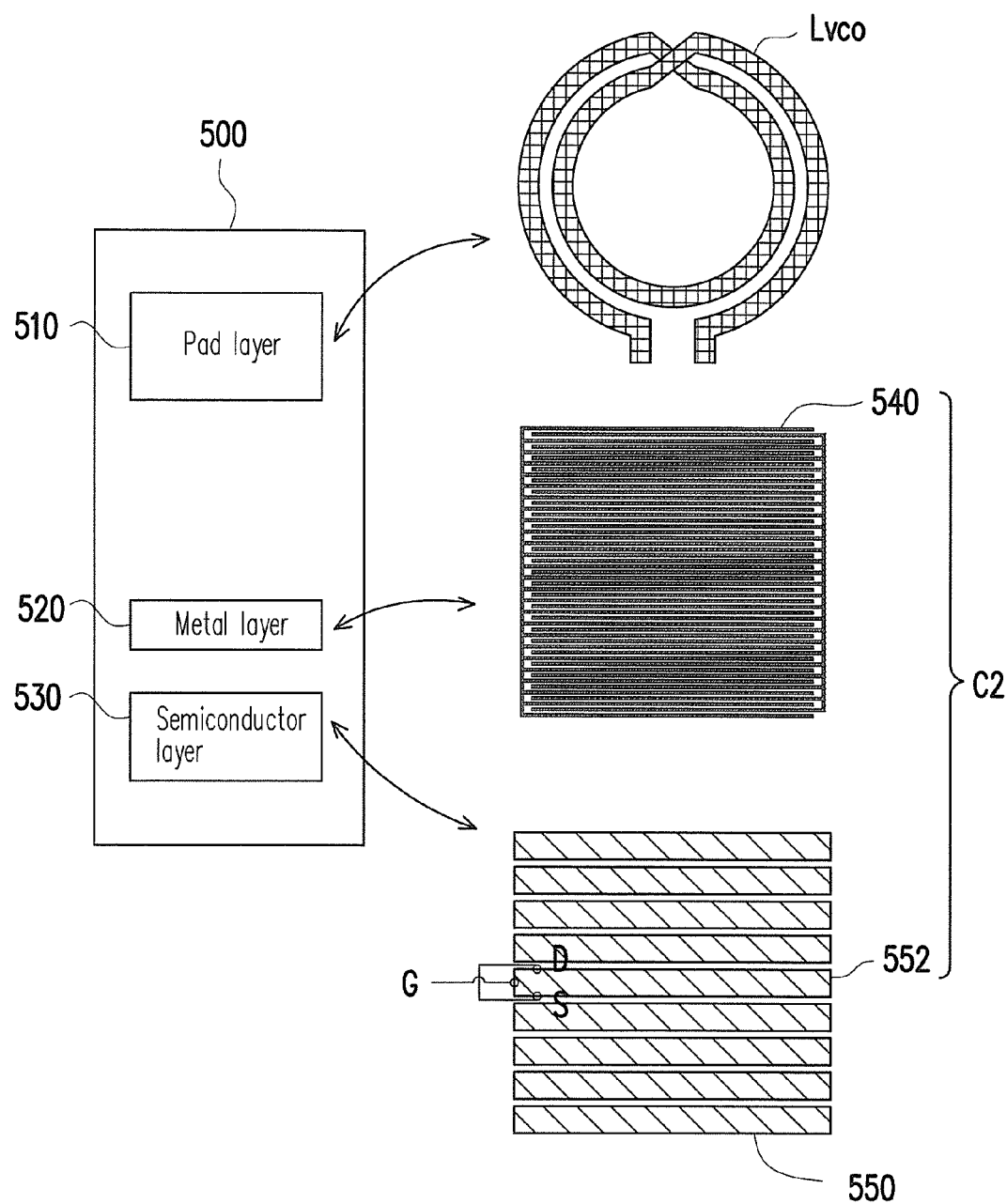
FIG. 5 is a cross-sectional view of a plurality of layers of a chip according to an exemplary embodiment.
Figure 6:
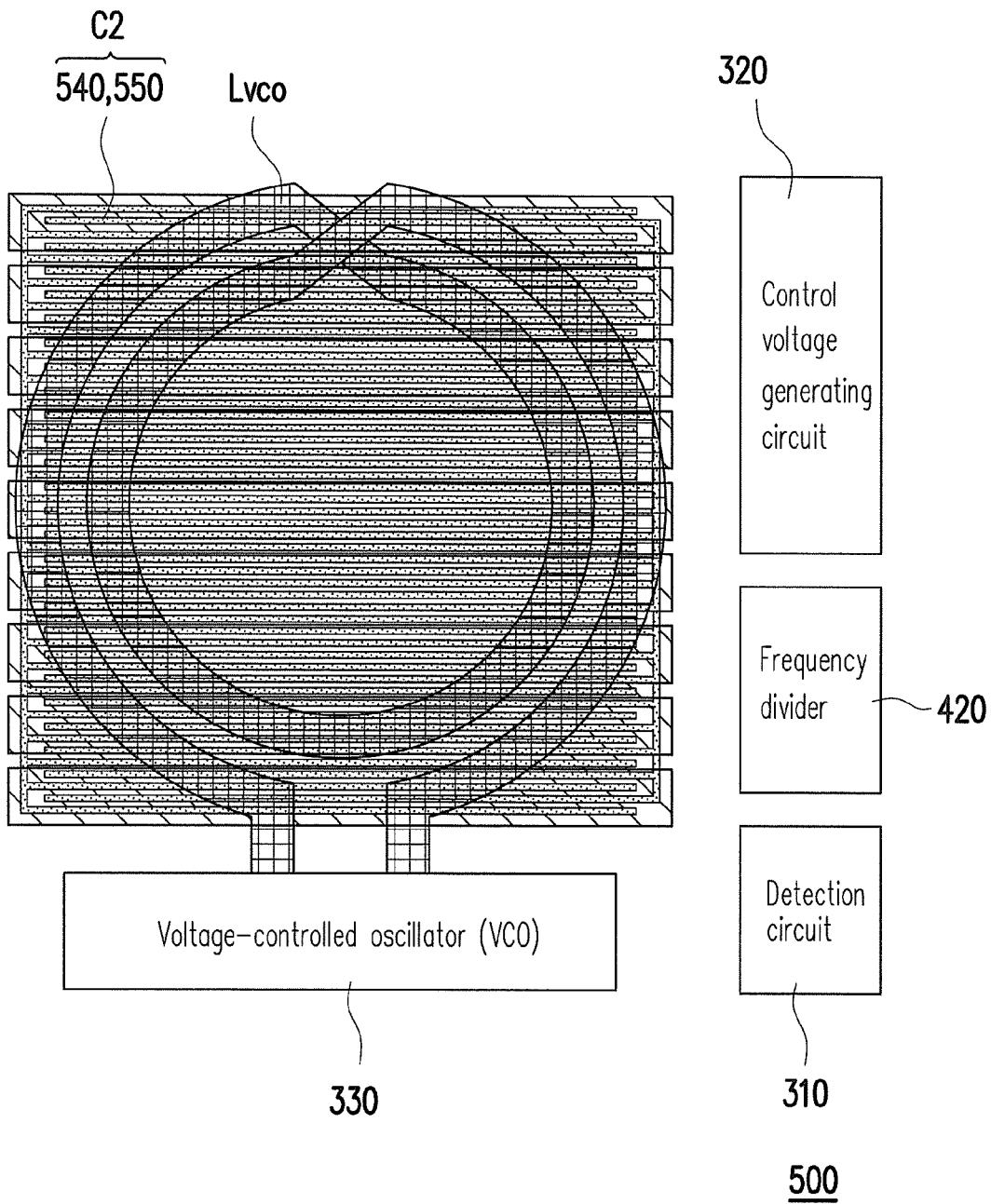
FIG. 6 is a top view of a chip according to an exemplary embodiment.

FIG. 5 is a cross-sectional view of a plurality of layers of a chip according to an exemplary embodiment. FIG. 6 is a top view of a chip according to an exemplary embodiment.

Referring to FIG. 5, the chip 500 includes a pad layer 510, a metal layer 520, and a semiconductor layer 530 that are stacked together. However, the present invention is not limited thereto, and the chip 500 may further include other metal layers, semiconductor layers, or layers of any other materials. In the present exemplary embodiment, the material of the metal layer 520 is substantially copper or copper compound, and the metal layer 520 can be served as transmission lines, power lines, signal lines, or passive devices (for example, capacitors) between different semiconductor devices. The material of the semiconductor layer 530 includes polysilicon or silicon compound, and the semiconductor layer 530 can be served as different semiconductor devices (for example, transistors or diodes) of the chip. The inductor Lvco is disposed on the pad layer 510. The filter capacitor C2 is implemented with a capacitor 540 and a capacitor 550 which are connected with each other in parallel. The capacitor 540 and the capacitor 550 are respectively disposed on the metal layer 520 and the semiconductor layer 530. To be specific, in the capacitor 540, thin metal lines are served as two ends of the capacitor, and a space or a dielectric layer is kept or disposed between the metal lines. It should be noted that the metal lines in the capacitor 540 are very long therefore can be served as the resistor R1 (referring to FIG. 4). On the other hand, the capacitor 550 is implemented with a transistor or a diode. If the capacitor 550 is implemented with a transistor, the transistor is a unipolar transistor (for example, a metal-oxide-semiconductor field-effect transistor (MOSFET) or a bipolar junction transistor (BJT), which is not limited in the present invention). For example, the transistor 552 is a MOSFET and is served as a capacitor. The source S and the drain D of the transistor 552 are coupled with each other to be served as one end of the capacitor, while the gate G of the transistor 552 is served as the other end of the capacitor. However, in another exemplary embodiment, the transistor 552 is a BJT. The collector and the emitter of the transistor 552 are coupled with each other to be served as one end of the capacitor, while the base of the transistor 552 is served as the other end of the capacitor. Or, when the capacitor 550 is implemented with a diode, the two ends of the diode are served as the two ends of the capacitor 550. In the present exemplary embodiment, the filter capacitor C2 is implemented with capacitors 540 and 550. However, the present invention is not limited thereto, and in another exemplary embodiment, the filter capacitor C2 may be implemented with only one of the capacitor 540 and the capacitor 550.

The filter capacitor C2 is disposed below the inductor Lvco. Namely, the projection of the filter capacitor C2 on the pad layer 510 overlaps the inductor Lvco. As shown in FIG. 6, when viewed from above, the inductor Lvco and the filter capacitor C2 overlap each other so that the surface area of the chip 500 is reduced. It should be noted that the chip 500 includes layers other than the metal layer 520 and the semiconductor layer 530, and the VCO 330, the detection circuit 310, the frequency divider 420, and the control voltage generating circuit 320 can be disposed on any one or more layers, which is not limited in the present invention. However, because the filter capacitor C2 is disposed below the inductor Lvco, an eddy current may be produced in the circuit on the filter capacitor C2 due to electromagnetic induction. The eddy current will lower the Q factor of the inductor Lvco. Thus, in an exemplary embodiment, the direction of the circuit on the filter capacitor C2 is perpendicular to the eddy current to reduce the eddy current. Different patterns of the filter capacitor C2 will be described with reference to several exemplary embodiments.

FIG. 7 to FIG. 11 are diagrams of filter capacitors according to an exemplary embodiment.

In an exemplary embodiment, the filter capacitor C2 includes a semiconductor device. When viewed from the top, a layout structure of the semiconductor device forms a broken line (i.e., the layout structure forms an angle, and the linear distance from the head to the tail of the layout structure is smaller than the length of the layout structure). The projection of the broken line on the pad layer 510 intersects two tangents of the inductor Lvco at two angles (referred to as a first angle and a second angle), where the two angles are not 0°. The semiconductor device may be a transistor or a diode. For example, when the semiconductor device is a diode, the layout structure of the diode forms the broken line. When the semiconductor device is a transistor, an output terminal (referred to as a first output terminal) of the transistor is coupled to another output terminal (referred to as a second output terminal) thereof, and the layout structure of a control terminal of the transistor forms the broken line. To be specific, if the transistor is a MOSFET, aforementioned two output terminals are respectively the source and the drain, and aforementioned control terminal is the gate. If the transistor is a BJT, aforementioned two output terminals are respectively the collector and the emitter, and aforementioned control terminal is the base.

Figure 7:
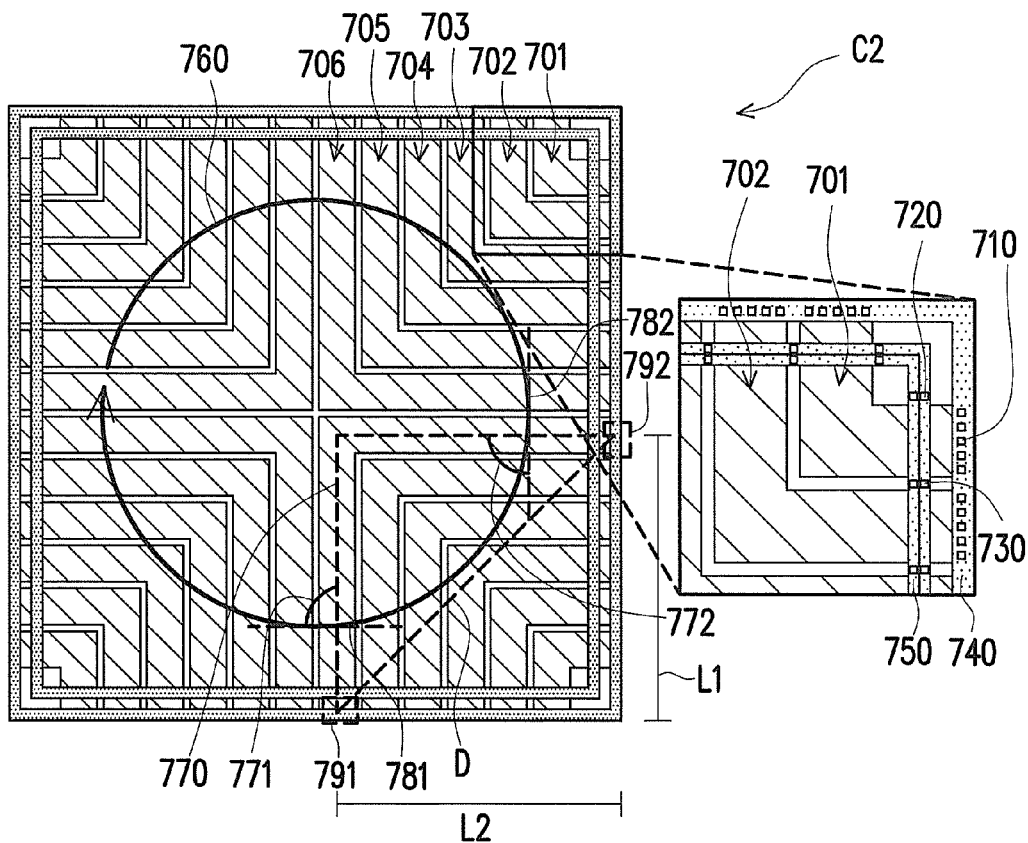
FIG. 7 to FIG. 11 are diagrams of filter capacitors according to an exemplary embodiment.

For example, in the exemplary embodiment illustrated in FIG. 7, the filter capacitor C2 includes a plurality of transistors (for example, transistors 701-706), and these transistors are MOSFETs. The gates of all the transistors are coupled with each other, and the sources and the drains thereof are coupled with each other. Taking the transistor 701 as an example, the gate thereof presents a L shape, and which is connected to a conductive line 740 through a via 710, and the conductive line 740 is coupled to the gates of other transistors. Two output terminals (i.e., the drain and the source) of the transistor 701 are connected to a conductive line 750 through vias 720 and 730, and the conductive line 750 is coupled to the sources and drains of other transistors. Besides, the output terminal (may be the drain or the source) of the transistor 701 corresponding to the via 730 and that of the transistor 702 are a common terminal. The material of the conductive lines 740 and 750 may be a metal or a high-impedance compound. However, whether the transistors 701-706 are N-type transistor or P-type transistors and which output terminal is served as the drain or source of each transistor are not limited in the present invention.

In the present exemplary embodiment, the inductor Lvco induces an eddy current 760 in the filter capacitor C2, and the direction (i.e., anticlockwise or clockwise) of the eddy current 760 is corresponding to the magnetic field direction variation of the inductor Lvco. The layout structure of the gate of a transistor in the filter capacitor C2 forms a broken line (for example, a broken line 770). The projection of the broken line 770 on the pad layer 510 intersects the tangent 781 of the inductor Lvco at an angle 771 (also referred to as a first angle). The projection of the broken line 770 on the pad layer 510 intersects the tangent 782 of the inductor Lvco at an angle 772 (also referred to as a second angle). The angles 771 and 772 are not 0°. In the present exemplary embodiment, the angles 771 and 772 are between 40° and 140° (for example, 90°). On the other hand, the layout structure of the broken line 770 forms an angle, and the linear distance D from the head 791 to the tail 792 of the layout structure is smaller than the length (the length L1 plus the length L2) of the layout structure. In the exemplary embodiment illustrated in FIG. 7, the layout structures of the gates of all the transistors in the filter capacitor C2 present an L shape. However, the present invention is not limited thereto, and in other exemplary embodiments, the gates of different transistors have different layout structures.

Figure 8:
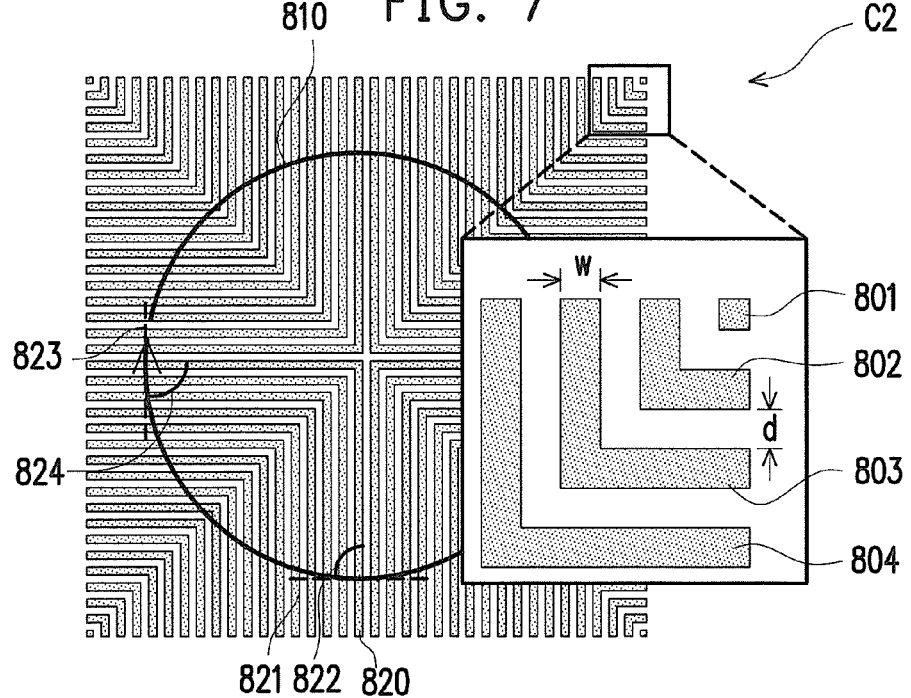

Referring to FIG. 8, in the exemplary embodiment illustrated in FIG. 8, the filter capacitor C2 includes a plurality of metal segments (for example, metal segments 801-804). The distance d between these metal segments is made as small as possible, and the width w thereof is also made as small as possible. Generally, the distance d is smaller than the width w. However, the values of the distance d and the width w are not limited in the present invention. In an exemplary embodiment, a metal segment in the filter capacitor C2 forms a broken line, the projection of the broken line on the pad layer intersects two tangents of the inductor Lvco at two angles (referred to as a first angle and a second angle), and the two angles are not 0°. For example, the metal segment 820 forms an angle 822 with the tangent 821 and forms an angle 824 with the tangent 823, where the angles 822 and 824 are not 0°. In the present exemplary embodiment, all the metal segments in FIG. 8 are arranged in an L shape, where the angles formed by several metal segments and the two corresponding tangents of the inductor Lvco are close or equal to 90° (for example, between 40° and 140°), so that the eddy current 810 can be reduced. It should be noted that the broken line formed by each metal segment in FIG. 8 has only one break angle, but in another exemplary embodiment, the broken line formed by each metal segment can have more break angles, and the angles of these break angles are not limited in the present invention. Or, different metal segments may have different break angles.

Figure 9:
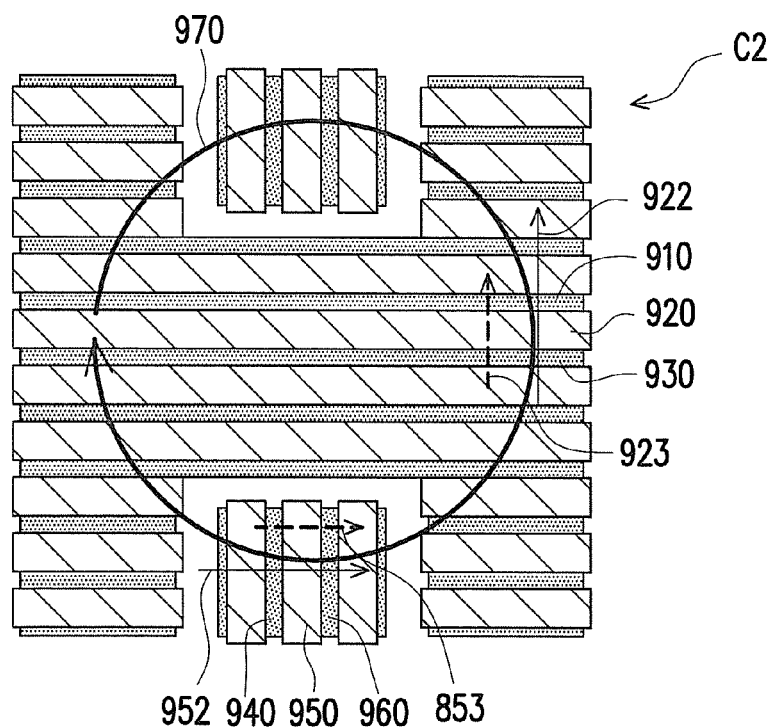

Referring to FIG. 9, in the exemplary embodiment illustrated in FIG. 9, the filter capacitor C2 includes a plurality of metal ends and a plurality of dielectric layers, where each dielectric layer is disposed between two metal ends (referred to as a first metal end and a second metal end). For example, the dielectric layer 920 is disposed between the metal end 910 and the metal end 930, and the dielectric layer 950 is disposed between the metal end 940 and the metal end 960. In the present exemplary embodiment, the material of the dielectric layers 920 and 950 is a polycrystalline material, and the material of the metal ends 910, 930, 940, and 960 is copper or a copper compound. However, the present invention is not limited thereto, and the material of the dielectric layers 920 and 950 may also be any other silicon compound or silicon oxide. Particularly, the projection of the extension line from the first metal end to the second metal end on the pad layer 510 is substantially parallel to the tangent of the inductor Lvco on the dielectric layer or forms an angle smaller than 10° with the tangent of the inductor Lvco on the dielectric layer. For example, the extension line 923 from the metal end 910 to the metal end 930 is parallel to the tangent 922 of the inductor Lvco on the dielectric layer 920 or forms an angle smaller than 10° with the tangent 922 of the inductor Lvco on the dielectric layer 920, and the extension line 953 from the metal end 940 to the metal end 960 is parallel to the tangent 952 of the inductor Lvco on the dielectric layer 950 or forms an angle smaller than 10° with the tangent 952 of the inductor Lvco on the dielectric layer 950. Thereby, the eddy current 970 is reduced.

Figure 10:
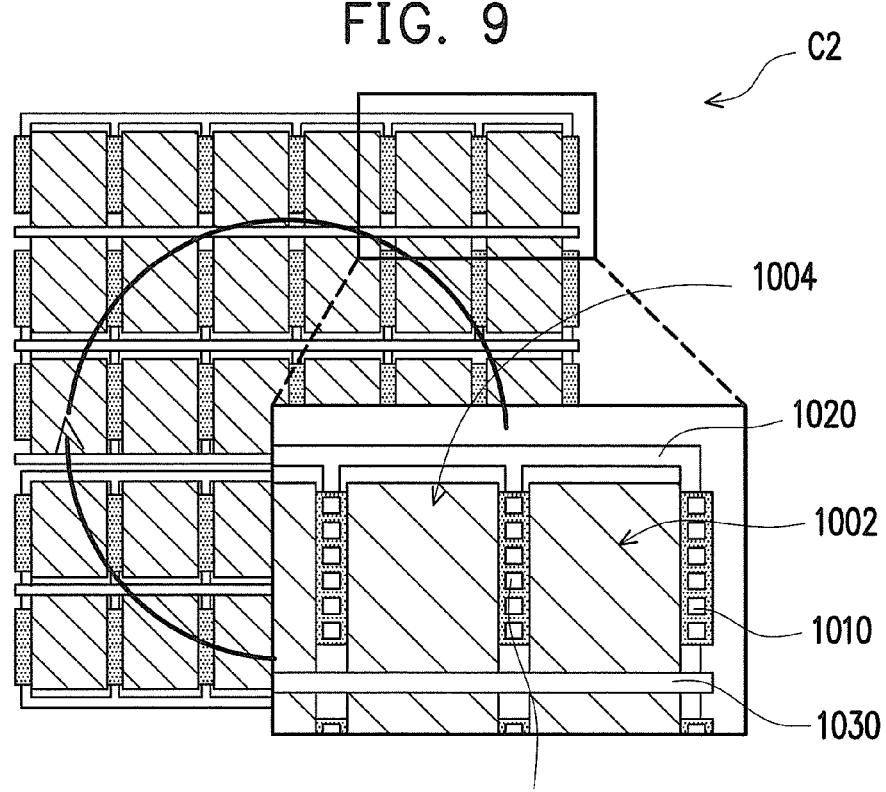

Referring to FIG. 10, in the exemplary embodiment illustrated in FIG. 10, the filter capacitor C2 includes a plurality of transistors (for example, transistors 1002 and 1004). In the present exemplary embodiment, the transistors are MOSFETs. Each transistor includes two output terminals (i.e., the source and drain), and the sources and collectors of the transistors are coupled with each other. For example, an output terminal of the transistor 1002 is coupled to a via 1010, and the via 1010 is coupled to a conductive line 1020. Besides, another output terminal of the transistor 1002 is coupled to a via 1012, and the via 1012 is also coupled to the conductive line 1020. In addition, the output terminal (the source or the drain) of the transistor 1002 corresponding to the via 1012 and that of the transistor 1004 are a common terminal. However, whether the transistors 1002 and 1004 are P-type transistors or N-type transistors and which output terminal of each transistor is served as the drain or source are not limited in the present invention. On the other hand, the gates of the transistors 1002 and 1004 are coupled to a conductive line 1030. The conductive line 1030 is served as one end of the filter capacitor C2, and the conductive line 1020 is served as another end of the filter capacitor C2. Particularly, the transistors in the filter capacitor C2 are arranged into an array to reduce the eddy current 1030. In an exemplary embodiment, the material of the conductive line 1020 and the conductive line 1030 is a non-salicide with high resistance. Thus, the conductive line 1020 and the conductive line 1030 can be served as a resistor R1 of the filter 410. However, the present invention is not limited thereto, and in another exemplary embodiment, the material of the conductive line 1020 and the conductive line 1030 may also be a metal.

Figure 11:
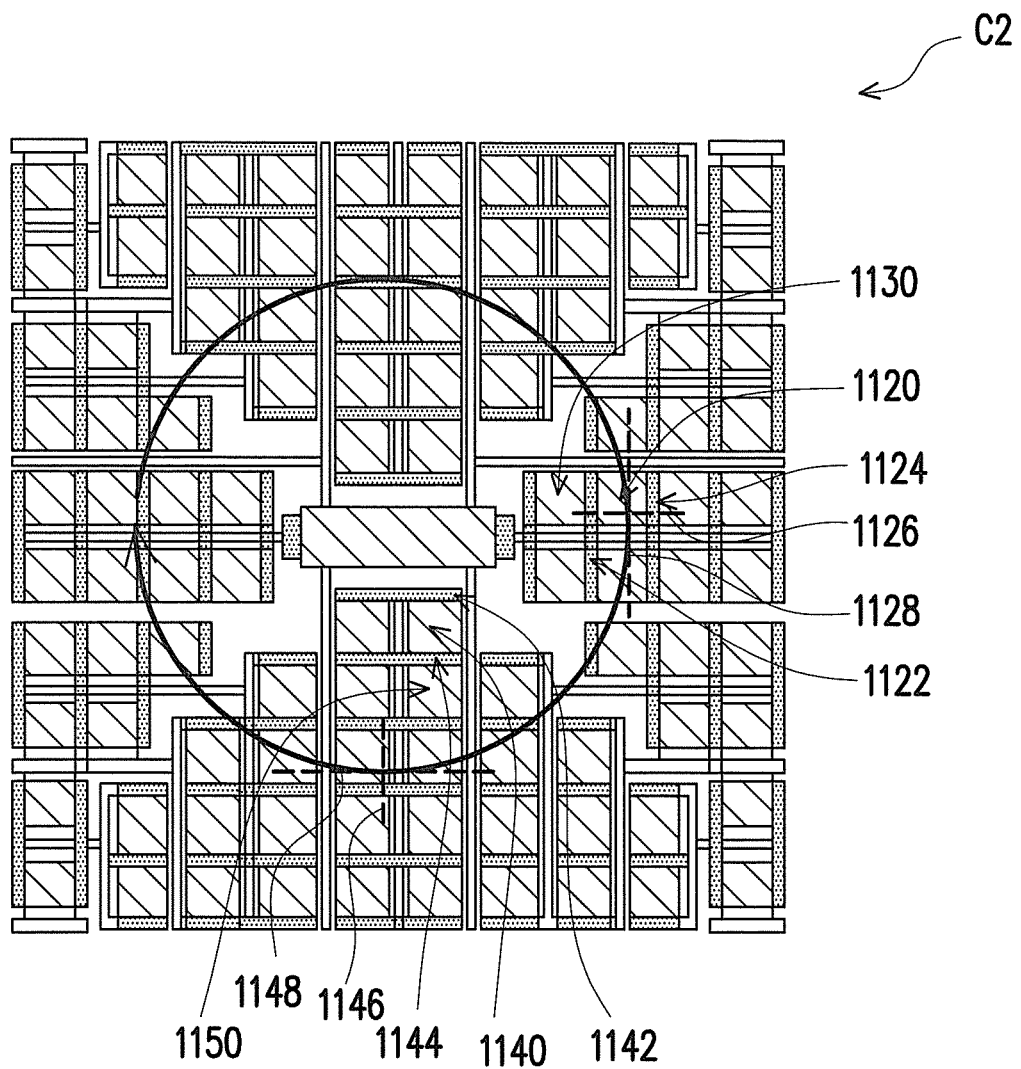

Referring to FIG. 11, in the exemplary embodiment illustrated in FIG. 11, the filter capacitor C2 includes a plurality of transistors. These transistors may be MOSFETs, and the connected transistors share a same output terminal. In the same transistor, the projection of an extension line from one output terminal to another output terminal on the pad layer 510 forms an angle between 40° and 140° with the inductor Lvco. For example, the output terminal 1122 of the transistor 1120 is shared with the transistor 1130, and the extension line 1126 from the output terminal 1122 to the output terminal 1124 intersects the tangent 1128 of the inductor Lvco at an angle close to 90°. Similarly, the output terminal 1144 of the transistor 1140 is shared with the transistor 1150, and the extension line 1146 from the output terminal 1144 to the output terminal 1142 intersects another tangent 1148 of the inductor Lvco at an angle close to 90°. In FIG. 11, the transistors present a pyramidal arrangement on the plane. Namely, these transistors are arranged into a plurality of rows (or columns), and the number of transistors on each row (or column) gradually increases (or decreases). However, the present invention is not limited thereto, and in another embodiment, these transistors may also present different arrangements.

It should be noted that the clock adjusting circuit 300 is disposed in the memory storage device 100. However, the present invention is not limited thereto, and in other exemplary embodiments, the clock adjusting circuit 300 may also be disposed in a communication device or any other type of electronic device.

Second Exemplary Embodiment

The second exemplary embodiment is similar to the first exemplary embodiment and only the differences between the two exemplary embodiments will be explained herein. In the second exemplary embodiment, the connect interface unit 102 includes an inductor and a capacitor. The inductor is disposed on a first layer of a die, and the capacitor is disposed on a second layer of the same die. The first layer is different from the second layer, and the first layer and the second layer may be pad layers or non-pad layers. Particularly, when viewed from a direction perpendicular to the first layer, the inductor and the capacitor at least partially overlap each other. The layout of the inductor and the capacitor is similar to that of the inductor Lvco and the filter capacitor C2 in the first exemplary embodiment. Namely, in the second exemplary embodiment, the inductor and the capacitor in the connect interface unit 102 can be disposed by referring to FIGS. 7-11. It should be noted that the inductor and the capacitor are not limited to a PLL or a clock data recovery circuit. Namely, the inductor and the capacitor can be of any function or purpose, which is not limited in the present invention.

As described above, exemplary embodiments of the present invention provide a clock adjusting circuit, a memory storage device and a memory control circuit unit, in which no additional mask process is performed and the chip area is reduced. In addition, because the circuit of a capacitor is perpendicular to the eddy current produced by an inductor, the impact brought by the eddy current can be reduced and the Q factor of the inductor can be increased.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the present invention. In view of the foregoing, it is intended that the present invention cover modifications and variations of this invention provided they fall within the scope of the following claims and their equivalents.

What is claimed is:

1. A clock adjusting circuit, disposed on a die, wherein the die has a plurality of layers, the clock adjusting circuit comprising:
   a detection circuit, configured to detect a signal characteristic difference between an input signal and an output signal to generate a first signal;
   a control voltage generating circuit, coupled to the detection circuit, and configured to generate a control voltage according to the first signal;
   a voltage-controlled oscillator (VCO), coupled to the control voltage generating circuit, and comprising a inductor and a capacitor, wherein the VCO is configured to receive the control voltage and oscillate according to an impedance characteristic of the inductor and the capacitor to generate the output signal, wherein the inductor is disposed on a pad layer among the layers; and
   a filter, coupled between the control voltage generating circuit and the VCO, wherein the filter comprises a filter capacitor, the filter capacitor is disposed on a first layer among the layers, the first layer is different from the pad layer, and when viewed from a direction perpendicular to the pad layer, the filter capacitor and the inductor at least partially overlap each other.

2. The clock adjusting circuit according to claim 1, wherein when viewed from the direction, at least 50% of the filter capacitor overlaps the inductor.

3. The clock adjusting circuit according to claim 1, wherein the filter capacitor comprises a semiconductor device, a layout structure of the semiconductor device forms a broken line, a projection of the broken line on the pad layer intersects two tangents of the inductor at a first angle and a second angle, and the first angle and the second angle are not 0°.

4. The clock adjusting circuit according to claim 3, wherein the semiconductor device is a transistor or a diode.

5. The clock adjusting circuit according to claim 3, wherein the semiconductor device is a transistor, a first output terminal of the transistor is coupled to a second output terminal of the transistor, and a layout structure of a control terminal of the transistor forms the broken line.

6. The clock adjusting circuit according to claim 1, wherein the filter capacitor comprises a metal segment, the metal segment forms a broken line, a projection of the broken line on the pad layer intersects two tangents of the inductor at a first angle and a second angle, and the first angle and the second angle are not 0°.

7. The clock adjusting circuit according to claim 1, wherein the filter capacitor comprises a plurality of metal segments, and the metal segments are arranged into an "L" shape.

8. The clock adjusting circuit according to claim 1, wherein the filter capacitor comprises a first metal end, a second metal end, and a dielectric layer, the dielectric layer is disposed between the first metal end and the second metal end, and a projection of an extension line from the first metal end to the second metal end on the pad layer is parallel to a tangent of the inductor on the dielectric layer or the extension line and the tangent form an angle smaller than 10°.

9. The clock adjusting circuit according to claim 1, wherein the filter capacitor comprises a plurality of transistors, each of the transistors comprises a first output terminal and a second output terminal, the first output terminals and the second output terminals are coupled with each other, and the transistors are arranged into an array.

10. The clock adjusting circuit according to claim 9, wherein the first output terminals and the second output terminals are coupled with each other through a conductive line, and a material of the conductive line is a non-salicide.

11. The clock adjusting circuit according to claim 1, wherein the filter capacitor comprises a first transistor and a second transistor, a first output terminal of the first transistor and a first output terminal of the second transistor are a common terminal, a projection of an extension line from the first output terminal of the first transistor to a second output terminal of the first transistor on the pad layer intersects a tangent of the inductor at an angle, and the angle is between 40° and 140°.

12. The clock adjusting circuit according to claim 1, wherein a material of the pad layer is substantially aluminium.

13. A memory storage device, comprising:
a connect interface unit, configured to couple to a host system;
a rewritable non-volatile memory module, comprising a plurality of physical erasing units; and
a memory control circuit unit, coupled to the connect interface unit and the rewritable non-volatile memory module,
wherein the connect interface unit comprises a clock adjusting circuit, the clock adjusting circuit is disposed on a die, the die has a plurality of layers, and the clock adjusting circuit comprises:
a detection circuit, configured to detect a signal characteristic difference between an input signal and an output signal to generate a first signal;
a control voltage generating circuit, coupled to the detection circuit, and configured to generate a control voltage according to the first signal; and
a voltage-controlled oscillator (VCO), coupled to the control voltage generating circuit, and comprising an inductor and a capacitor, wherein the VCO is configured to receive the control voltage and oscillate according to an impedance characteristic of the inductor and the capacitor to generate the output signal,
wherein the inductor is entirely disposed on a pad layer among the layers.

14. The memory storage device according to claim 13, wherein the clock adjusting circuit further comprises:
a filter, coupled between the control voltage generating circuit and the VCO, wherein the filter comprises a filter capacitor, the filter capacitor is disposed on a first layer among the layers, the first layer is different from the pad layer, and when viewed from a direction perpendicular to the pad layer, the filter capacitor and the inductor at least partially overlap each other.

15. The memory storage device according to claim 14, wherein when viewed from the direction, at least 50% of the filter capacitor overlaps the inductor.

16. The memory storage device according to claim 14, wherein the filter capacitor comprises a semiconductor device, a layout structure of the semiconductor device forms a broken line, a projection of the broken line on the pad layer intersects two tangents of the inductor at a first angle and a second angle, and the first angle and the second angle are not 0°.

17. The memory storage device according to claim 16, wherein the semiconductor device is a transistor or a diode.

18. The memory storage device according to claim 16, wherein the semiconductor device is a transistor, a first output terminal of the transistor is coupled to a second output terminal of the transistor, and a layout structure of a control terminal of the transistor forms the broken line.

19. The memory storage device according to claim 14, wherein the filter capacitor comprises a metal segment, the metal segment forms a broken line, a projection of the broken line on the pad layer intersects two tangents of the inductor at a first angle and a second angle, and the first angle and the second angle are not 0°.

20. The memory storage device according to claim 14, wherein the filter capacitor comprises a plurality of metal segments, and the metal segments are arranged into an "L" shape.

21. The memory storage device according to claim 14, wherein the filter capacitor comprises a first metal end, a second metal end, and a dielectric layer, the dielectric layer is disposed between the first metal end and the second metal end, a projection of an extension line from the first metal end to the second metal end on the pad layer is substantially parallel to a tangent of the inductor on the dielectric layer or the extension line and the tangent form an angle smaller than 10°.

22. The memory storage device according to claim 14, wherein the filter capacitor comprises a plurality of transistors, each of the transistors comprises a first output terminal and a second output terminal, the first output terminals and the second output terminals are coupled with each other, and the transistors are arranged into an array.

23. The memory storage device according to claim 22, wherein the first output terminals and the second output terminals are coupled with each other through a conductive line, and a material of the conductive line is a non-salicide.

24. The memory storage device according to claim 14, wherein the filter capacitor comprises a first transistor and a second transistor, a first output terminal of the first transistor and a first output terminal of the second transistor are a common terminal, a projection of an extension line from the first output terminal of the first transistor to a second output terminal of the first transistor on the pad layer intersects a tangent of the inductor at an angle, and the angle is between 40° and 140°.

25. The memory storage device according to claim 13, wherein a material of the pad layer is substantially aluminium.

26. A memory storage device, comprising:
a connect interface unit, configured to couple to a host system;
a rewritable non-volatile memory module, comprising a plurality of physical erasing units; and
a memory control circuit unit, coupled to the connect interface unit and the rewritable non-volatile memory module,
wherein the connect interface unit comprises an inductor and a capacitor, the inductor is disposed on a first layer of a die, the capacitor is disposed on a second layer of the die, the first layer is different from the second layer, and when viewed from a direction perpendicular to the first layer, the inductor and the capacitor at least partially overlap each other.

27. A memory control circuit unit comprising:
a connect interface unit, configured to couple to a host system; and
a memory management circuit coupled to the connect interface unit,
wherein the connect interface unit comprises a clock adjusting circuit, the clock adjusting circuit is disposed on a die, the die has a plurality of layers, and the clock adjusting circuit comprises:

a detection circuit, configured to detect a signal characteristic difference between an input signal and an output signal to generate a first signal;

a control voltage generating circuit, coupled to the detection circuit, and configured to generate a control voltage according to the first signal;

a voltage-controlled oscillator (VCO), coupled to the control voltage generating circuit, and comprising an inductor and a capacitor, wherein the VCO is configured to receive the control voltage and oscillate according to an impedance characteristic of the inductor and the capacitor to generate the output signal, wherein the inductor is disposed on a pad layer among the layers, and a filter, coupled between the control voltage generating circuit and the VCO, wherein the filter comprises a filter capacitor, the filter capacitor is disposed on a first layer among the layers, the first layer is different from the pad layer, and when viewed from a direction perpendicular to the pad layer, the filter capacitor and the inductor at least partially overlap each other.

* * * * *